(12) United States Patent
Shih

(10) Patent No.: US 10,381,301 B2
(45) Date of Patent: Aug. 13, 2019

(54) SEMICONDUCTOR PACKAGE AND METHOD FOR FABRICATING THE SAME

(71) Applicant: Micron Technology, Inc., Boise, ID (US)

(72) Inventor: Shing-Yih Shih, New Taipei (TW)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 15/428,124

(22) Filed: Feb. 8, 2017

(65) Prior Publication Data

US 2018/0226333 A1    Aug. 9, 2018

(51) Int. Cl.
*H01L 23/498*  (2006.01)
*H01L 23/00*  (2006.01)
(Continued)

(52) U.S. Cl.
CPC .... *H01L 23/49838* (2013.01); *H01L 21/4853* (2013.01); *H01L 21/4857* (2013.01); *H01L 21/56* (2013.01); *H01L 21/561* (2013.01); *H01L 21/6835* (2013.01); *H01L 23/3135* (2013.01); *H01L 23/49822* (2013.01); *H01L 24/16* (2013.01); *H01L 24/19* (2013.01); *H01L 24/20* (2013.01); *H01L 25/0655* (2013.01); *H01L 25/50* (2013.01); *H01L 23/3128* (2013.01); *H01L 2221/68345* (2013.01); *H01L 2221/68359* (2013.01); *H01L 2224/04105* (2013.01); *H01L 2224/12105* (2013.01); *H01L 2224/16235* (2013.01); *H01L 2224/16238* (2013.01); *H01L 2224/81005* (2013.01);
(Continued)

(58) Field of Classification Search
CPC ........... H01L 23/49838; H01L 21/4853; H01L 21/4857; H01L 21/565; H01L 21/78; H01L 23/3114; H01L 23/49822; H01L 24/16; H01L 25/0655; H01L 25/50; H01L 2224/16235
See application file for complete search history.

(56) References Cited

U.S. PATENT DOCUMENTS 7,372,141 B2 *  5/2008  Karnezos ............ H01L 25/0657
                                                257/686
7,619,901 B2 * 11/2009  Eichelberger ....... H01L 21/6835
                                                361/763

(Continued)

*Primary Examiner* — Fernando L Toledo
*Assistant Examiner* — Neil R Prasad
(74) *Attorney, Agent, or Firm* — TraskBritt

(57) ABSTRACT

A semiconductor package including at least one semiconductor device, a first redistribution layer, a first molding compound, a second molding compound, conductive vias and a second redistribution layer. The first redistribution layer is disposed beneath the semiconductor device and electrically connected to the semiconductor device. The first molding compound is disposed over the first redistribution layer and surrounds the semiconductor device. The second molding compound surrounds the first redistribution layer and at least a part of the first molding compound. The conductive vias extend through the second molding compound. The second redistribution layer is disposed on a surface of the second molding compound away from the first redistribution layer. The second redistribution layer is electrically connected to the first redistribution layer through the conductive vias.

20 Claims, 8 Drawing Sheets

(51) Int. Cl.
*H01L 21/48* (2006.01)
*H01L 25/065* (2006.01)
*H01L 25/00* (2006.01)
*H01L 23/31* (2006.01)
*H01L 21/56* (2006.01)
*H01L 21/683* (2006.01)

(52) U.S. Cl.
CPC *H01L 2224/97* (2013.01); *H01L 2924/00014* (2013.01); *H01L 2924/15192* (2013.01); *H01L 2924/15311* (2013.01); *H01L 2924/18161* (2013.01); *H01L 2924/18162* (2013.01)

(56) References Cited

U.S. PATENT DOCUMENTS

| | | | |
|---|---|---|---|
| 2011/0147911 A1* | 6/2011 | Kohl | H01L 21/6835 257/686 |
| 2011/0285005 A1 | 11/2011 | Lin et al. | |
| 2014/0008809 A1 | 1/2014 | Scanlan | |
| 2016/0071829 A1* | 3/2016 | Yu | H01L 21/56 257/773 |
| 2016/0118333 A1* | 4/2016 | Lin | H01L 24/97 257/773 |
| 2018/0108638 A1* | 4/2018 | Lin | H01L 25/105 |

* cited by examiner

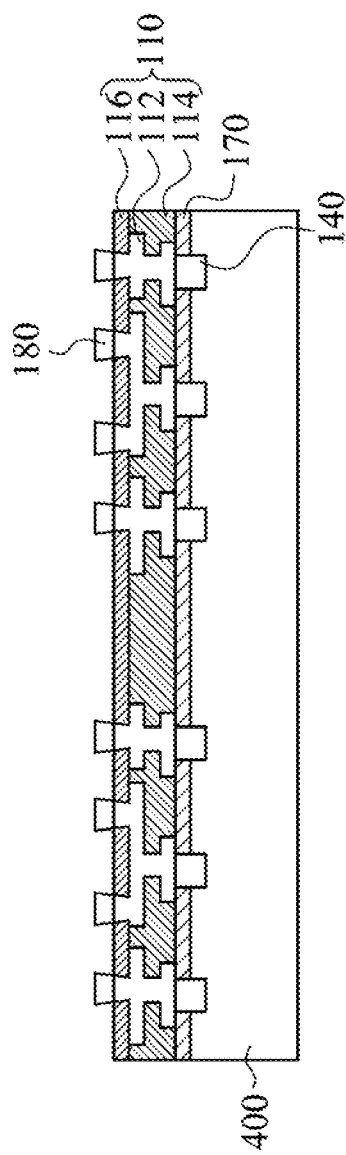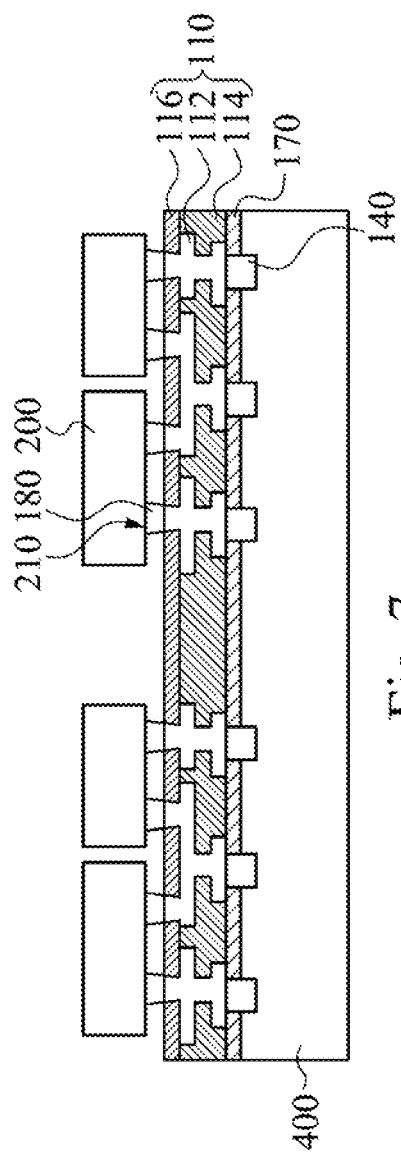

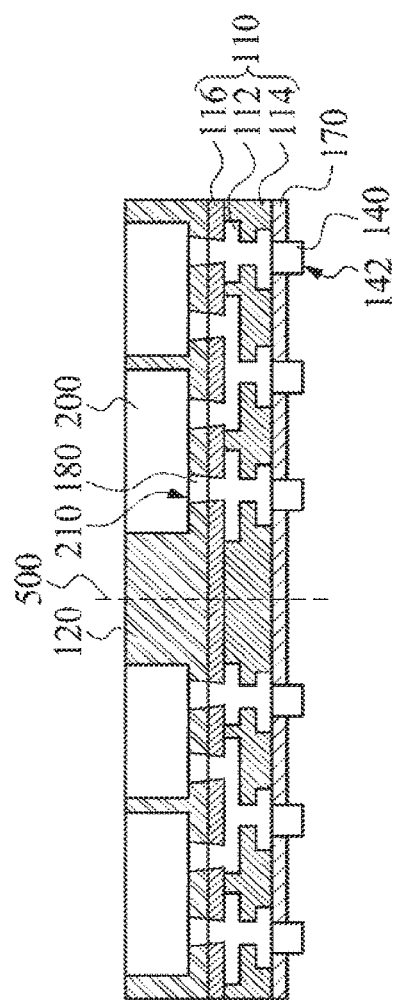
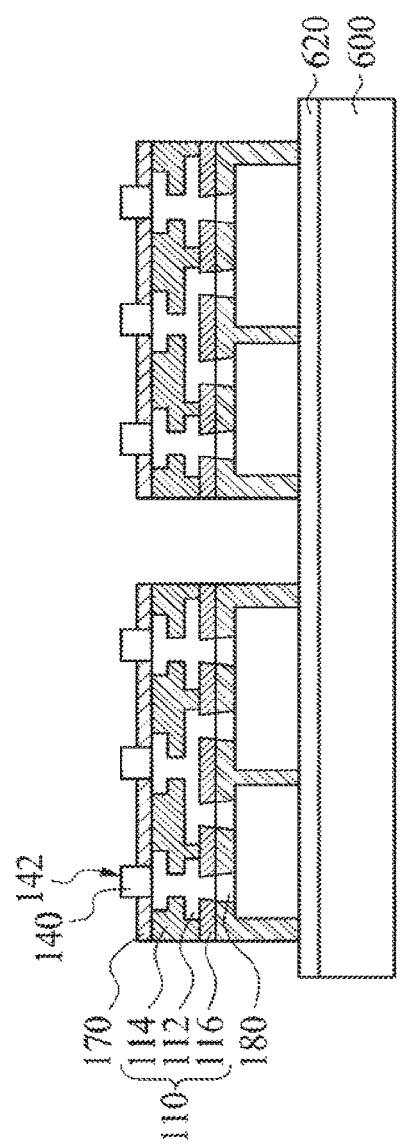

SEMICONDUCTOR PACKAGE AND METHOD FOR FABRICATING THE SAME

TECHNICAL FIELD

The present disclosure relates to a semiconductor package and a method of fabricating a semiconductor package.

BACKGROUND

With semiconductor packaging, the semiconductor product could be more compactly integrated, and provide a better performance with greater miniaturization. As a consequence, methods for fabricating semiconductor packages, such as wire bonding, flip chip, wafer level packaging, and panel level packaging, are developed to fulfill different demands. The redistribution layer may be adopted in some of the methods for fabricating semiconductor packages to assemble the components of the semiconductor packages and fan-out the semiconductor devices embedded inside the semiconductor packages. However, the connection configuration of the adopted redistribution layer is hard to adapt semiconductor packages fabricated by different packaging techniques, and may greatly decrease the efficiency of transporting signals or energy into the packaged semiconductor devices. Moreover, the losses of transportation may further generate heat accumulated inside the semiconductor package. As a consequence; the semiconductor packages may work more inefficiently. Therefore, with the available structure of semiconductor packages and the fabrication of the semiconductor packages, as described above, apparently exist inconvenience and defect, which may need further improvement. To deal with the aforesaid problem, practitioners of ordinary skill in the art have strived to attain a solution, and the problem still lacks a suitable solution to be developed. Therefore, to deal with the aforesaid problem effectively is an important subject of research and development, and also a desired improvement in the art.

BRIEF SUMMARY

The present disclosure provides a semiconductor package. The semiconductor package includes at least one semiconductor device, a first redistribution layer, a first molding compound, a second molding compound, conductive vias and a second redistribution layer. The first redistribution layer is disposed beneath the semiconductor device and electrically connected to the semiconductor device. The first molding compound is disposed over the first redistribution layer and surrounding the semiconductor device. The second molding compound is surrounded by the first redistribution layer and at least a part of the first molding compound. The conductive vias are extended through the second molding compound. The second redistribution layer is disposed on a surface of the second molding compound away from the first redistribution layer. The second redistribution layer is electrically connected to the first redistribution layer through the conductive vias.

The present disclosure provides a method for fabricating a semiconductor package. The method includes: providing a workpiece including a first redistribution layer, conductive vias and a first substrate, in which the conductive vias extend into the first substrate and the first redistribution layer is disposed on the first substrate and connected to the conductive vias; subsequently disposing at least one semiconductor device on a side of the first redistribution layer away from the conductive vias, and the semiconductor device being connected to the first redistribution layer; subsequently forming a first molding compound to surround the semiconductor device; subsequently removing the first substrate; subsequently forming a second molding compound to surround the first redistribution layer and at least part of the first molding compound, in which the conductive vias are exposed on a surface of the second molding compound away from the dielectric layer; and then forming a second redistribution layer on a surface of the second molding compound away from the first redistribution layer and electrically connected to the first redistribution layer through the conductive vias.

It is to be understood that both the foregoing general description and the following detailed description are for example only, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 3 to FIG. 15 are simplified fragmentary cross-sectional views of semiconductor packages at various stages according to an embodiment of the present disclosure.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
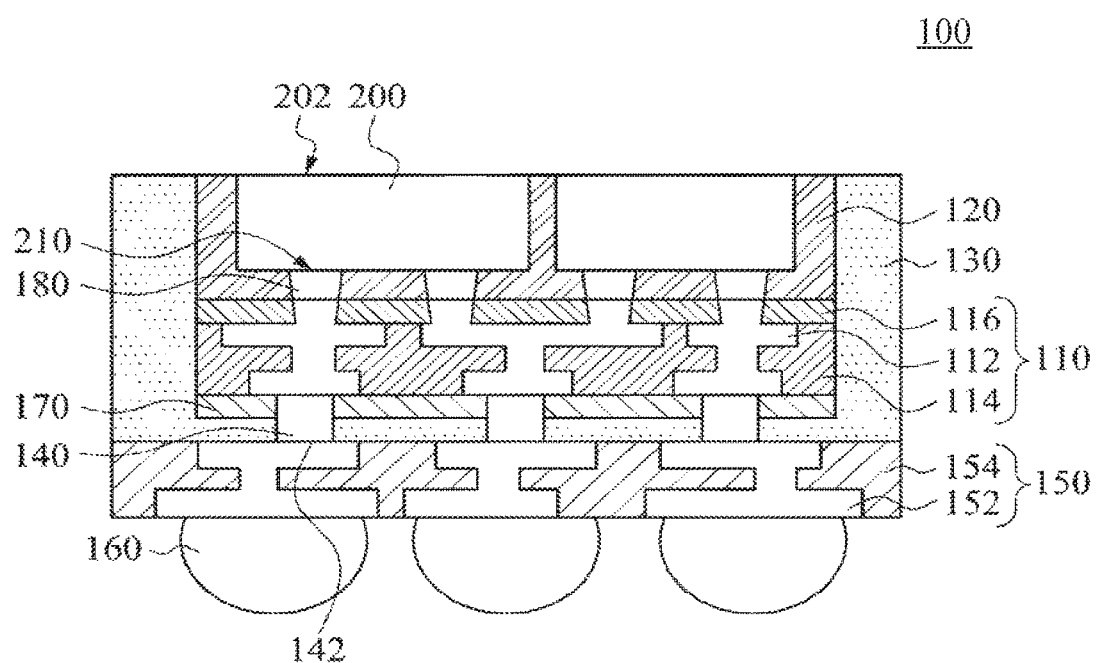
FIG. 1 is a cross-sectional view of a semiconductor package according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower" can, therefore, encompass both an orientation of "lower" and "upper," depending upon the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Reference is made to FIG. 1. FIG. 1 illustrates a cross-sectional view of a semiconductor package 100 according to some embodiments of the present disclosure. As shown in FIG. 1, in some embodiments, the semiconductor package 100 may include at least one semiconductor device 200, a first redistribution layer 110, a first molding compound 120, a second molding compound 130, conductive vias 140 and a second redistribution layer 150. The first redistribution layer 110 can be disposed beneath the semiconductor device 200 and electrically connected to the semiconductor device 200. More specifically, in some embodiments, the first redistribution layer 110 may include first dielectric layers 114 and first conductive routes 112, embedded inside the first dielectric layers 114. In some embodiments, materials of the first dielectric layers 114 can be inorganic dielectric materials, such as silicon nitride (SiN), silicon dioxide (SiO2), . . . etc. In other embodiments, materials of the first dielectric layers 114 can be organic dielectric materials, such as benzocyclobutene (BCB), polyimide (PI), polybenzoxazoles (PBO), . . . etc. The first conductive routes 112 are connected to at least one semiconductor device 200. In some embodiments, the semiconductor device 200 may have active surfaces 210, and the first conductive routes 112 are electrically connected to at least one of the active surfaces 210. In some embodiments, the semiconductor package 100 may include two or more semiconductor devices 200. The semiconductor devices 200 can be inter-connected through the first conductive routes 112, for example, the first conductive routes 112 interconnected between two semiconductor devices 200.

In some embodiments, the first molding compound 120 is disposed over the first redistribution layer 110, and surrounds the semiconductor device 200. More specifically, one or more semiconductor devices 200 are surrounded by the first molding compound 120 to form a single-chip module or a multi-chip module, and the first redistribution layer 110 may connect to one or more semiconductor devices 200 inside a single-chip module or a multi-chip module. In some embodiments, the space sandwiched between the first redistribution layer 110 and the semiconductor device 200 may be filled up with the first molding compound 120. In other embodiments, a bonding material (not illustrated) can be formed between the first redistribution layer 110 and the semiconductor device 200 to reinforce the bonding strength.

In some embodiments, the first redistribution layer 110 and at least a part of the first molding compound 120 is surrounded by the second molding compound 130. In other words, the first redistribution layer 110 is collectively encapsulated by the first molding compound 120 and the second molding compound 130. In some embodiments, materials of the second molding compound 130 are different than materials of the first molding compound 120. In some embodiments, the second molding compound 130 can be formed after the formation of the first molding compound 120, such that the glass transition temperature ($T_g$) of the first molding compound 120 is greater than the glass transition temperature of the second molding compound 130.

In some embodiments, the second redistribution layer 150 is disposed on a surface of the second molding compound 130 faced away from the first redistribution layer 110, and the conductive vias 140 are extended through the second molding compound 130 and connect between the second redistribution layer 150 and the first redistribution layer 110. As a consequence, the second redistribution layer 150 can be electrically connected to the first redistribution layer 110 and the semiconductor device 200 through the conductive vias 140. In some embodiments, the second redistribution layer 150 may include second dielectric layers 154 and second conductive routes 152, embedded inside the second dielectric layers 154. The second conductive routes 152 are connected to the conductive vias 140, respectively. In some embodiments, materials of the second dielectric layers 154 can be organic dielectric materials, such as benzocyclobutene (BCB), polyimide (PI), polybenzoxazoles (PBO), . . . etc.

Because the semiconductor device 200 can be assembled to the first redistribution layer 110 in wafer-level chip-scale packaging (WL-CSP), and the second redistribution layer 150 can be assembled onto the second molding compound 130 in panel-level packaging (PLP), the fabrication of the semiconductor package 100 can be achieved in two different levels of packaging. Consequently, the fan-out structure of the semiconductor package 100, assembled by the first redistribution layer 110, the conductive vias 140 and the second redistribution layer 150, can bridge two different levels packaging techniques, such as wafer-level chip-scale packaging and panel-level packaging, the semiconductor package 100 would be benefitted with greater compatibility and feasibility, in which various connecting configurations, such as various semiconductor devices 200 and fan-out connections connecting with other component or I/O connections, can be easily adapted.

In addition, the dielectric properties of the semiconductor package 100 can be adjusted in the manner that forming the first redistribution layer 110 and the second redistribution layer 150 with different inorganic or organic dielectric materials to modify the dielectric properties, the semiconductor package 100 may have greater flexibilities and capabilities in adjustment of the dielectric properties.

In some embodiments, the smallest pitch width of the first redistribution layer 110 can be distinct from the smallest pitch width of the second redistribution layer 150. For example, the smallest pitch width of the first redistribution layer 110 can be smaller for connecting with the fine-pitch semiconductor device 200. For example, the smallest pitch width of the second redistribution layer 150 can be greater for connecting with I/O fan out. In some embodiments, the smallest pitch width of the second redistribution layer 150 is greater or equal to the smallest pitch width of the first redistribution layer 110. Therefore, the semiconductor package 100 can adapt to electronic connections with various sizes.

In some embodiments, the semiconductor package 100 may further include a third dielectric layer 170. The third dielectric layer 170 is disposed on the surface of the first redistribution layer 110 away from the first molding compound 120, and the conductive vias are further extended through the third dielectric layer 170. In some embodiments, the dielectric coefficient of the third dielectric layer 170, the first redistribution layer 110, and the second redistribution layer 150 can be adjusted for actual demands. For example, at least one of the dielectric coefficients of the third dielectric layer 170, the dielectric coefficient of the first redistribution layer 110, and a dielectric coefficient of the second redistribution layer 150 can be different from the others of the dielectric coefficients.

In some embodiments, the semiconductor package 100 may further include solder balls 160. The solder balls 160 are disposed on and connected to the second conductive routes 152, respectively. In some embodiments, the semiconductor package 100 may further include conductive bumps 180. The conductive bumps 180 extend through the first molding compound 120 in order to electrically connect the first redistribution layer 110, especially the first conductive routes 112, to the semiconductor device.

Figure 2:
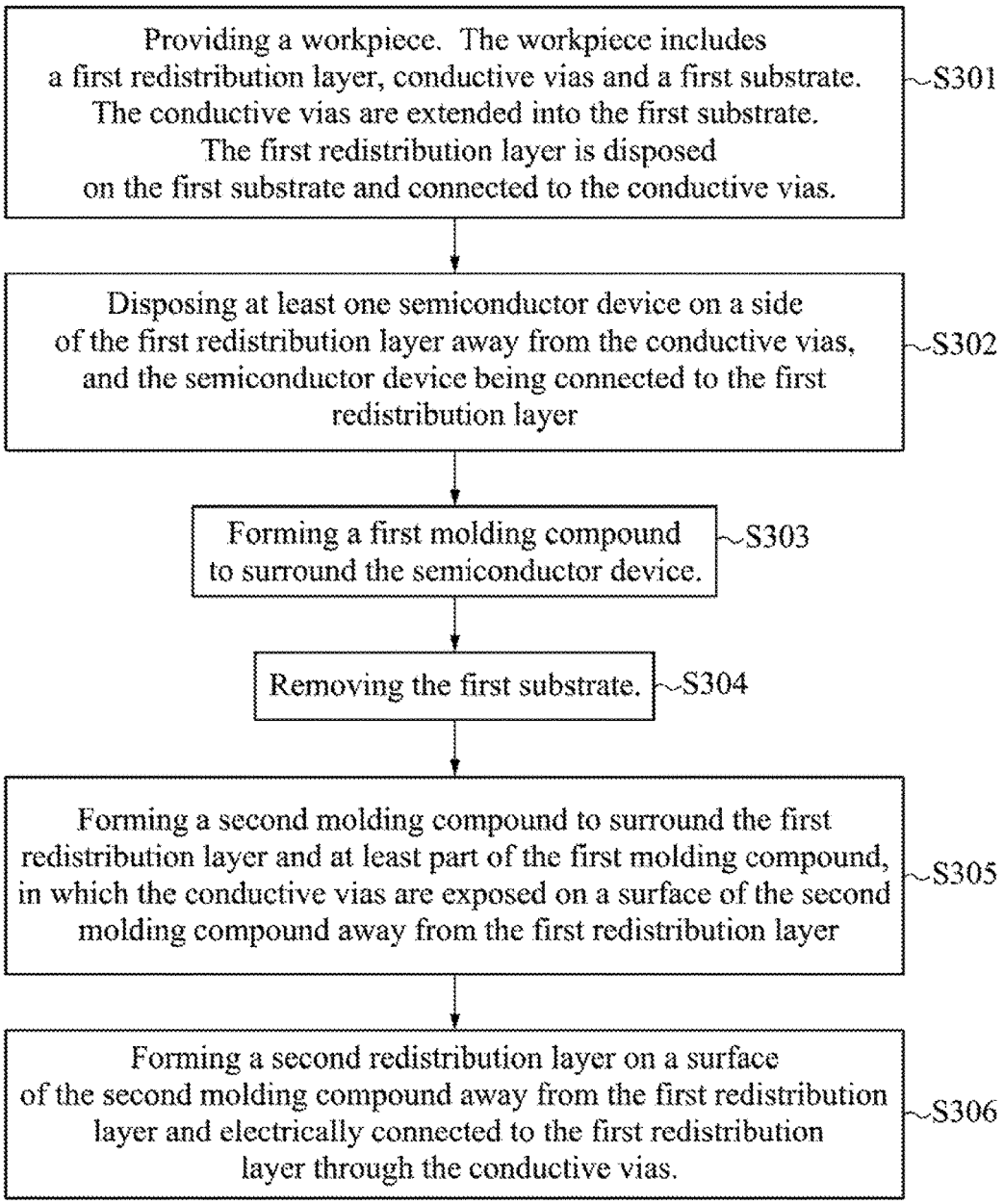
FIG. 2 is a flowchart illustrating a method for fabricating semiconductor packages according to an embodiment of the present disclosure.

Reference is made to FIG. 2. FIG. 2 illustrates a flowchart illustrating a method 300 for fabricating semiconductor packages according to an embodiment of the present disclosure. As shown in FIG. 2, the method 300 begins with step S301 in which a workpiece is provided (referring to FIG. 6). The workpiece includes a first redistribution layer, conductive vias and a first substrate. The conductive vias are extended into the first substrate. The first redistribution layer is disposed on the first substrate and connected to the conductive vias. Subsequently, the method 300 continues with step S302 in which at least one semiconductor device is disposed on a side of the first redistribution layer away from the conductive vias. The semiconductor device is connected to the first redistribution layer. Subsequently, the method 300 continues with step S303 in which a first molding compound is formed over the first redistribution layer to surround the semiconductor device. Subsequently, the method 300 continues with step S304 in which the first substrate is removed to expose an end of each of the conductive vias.

Subsequently, the method 300 continues with step S305 in which a second molding compound is formed to surround the first redistribution layer and at least part of the first molding compound. The conductive vias are exposed on a surface of the second molding compound away from the first dielectric layers of the first redistribution layer. Subsequently, the method 300 continues with step S306 in which a second redistribution layer is formed on a surface of the second molding compound away from the first redistribution layer. The second redistribution layer is electrically connected to the first redistribution layer through the exposed conductive vias.

Because the semiconductor packages fabricated in method 100 include the first redistribution layer and the second redistribution layer for adapting various connecting configurations, such as fine-pitch semiconductor device, large-sized I/O fan out connections, conductive paths connected between the semiconductor device and the other components can be established. Furthermore, the semiconductor packages can be formed in two different levels of packaging, for example, the semiconductor device can be connected to the workpiece in wafer-level chip-scale packaging (WL-CSP) or fan-out wafer level package (FO-WLP), and the second redistribution layer can be formed onto the second molding compound in panel-level packaging (PLP). Therefore, the forming of the semiconductor packages can bridge two different levels packaging techniques, such as wafer-level chip-scale packaging and panel-level packaging, so as to benefit the fabrication of the semiconductor packages for more flexibilities and compatibilities.

Figure 3:
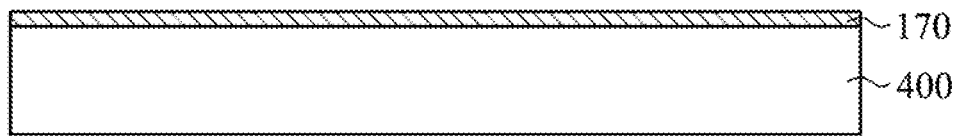
Figure 4:
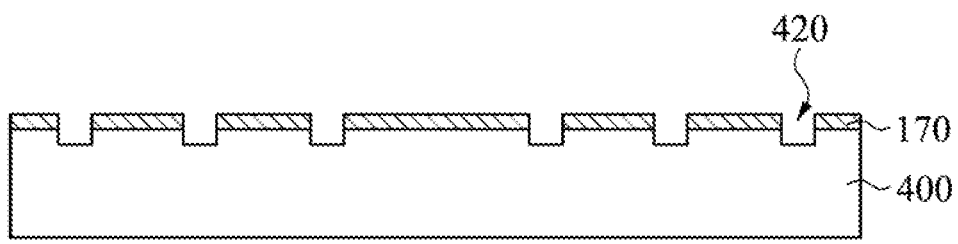
Figure 5:
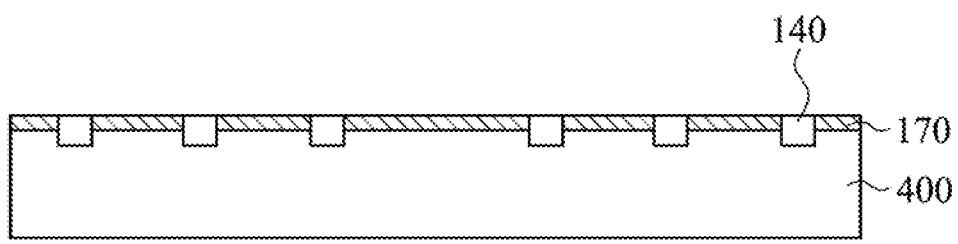

Reference is made to FIG. 3 to FIG. 15. FIG. 3 to FIG. 15 illustrate simplified fragmentary cross-sectional views of semiconductor packages 100 at various stages according to an embodiment of the present disclosure. As shown in FIG. 3, a first substrate 400 is provided. A third dielectric layer 170 can be formed on the first substrate 400. In some embodiments, the first substrate 400 can be a wafer. The third dielectric layer 170 is deposited on the first substrate 400. Subsequently, referring to FIG. 4, trenches 420 can be formed. The trenches 420 are extended through the third dielectric layer 170 and further extended into the first substrate 400. Referring to FIG. 5, a conductive material can be filled into the trenches subsequently, to form the conductive vias 140.

Reference is made to FIG. 6, which may correspond to step S301. As shown in FIG. 6, in some embodiments, a first redistribution layer 110 can be formed on the third dielectric layer 170. In some embodiments, the first redistribution layer 110 may include first conductive routes 112 embedded inside first dielectric layers 114. More specifically, in some embodiments, the first redistribution layer 110 can be formed in the manner of forming the first conductive routes 112 on at least one first dielectric layer 114 having an opening to expose an underlying conductive feature, such as the conductive vias 140, and another first dielectric layer 114 can be formed with an opening to expose the first conductive routes 112 on different locations for further bonding. In some embodiments, the first dielectric layer 114 can be formed by passivation material or dielectric material, such as, silicon nitride, silicon dioxide, other inorganic dielectric materials, benzocyclobutene, polyimide, polybenzoxazoles, or other organic dielectric materials. One end of a first conductive route 112 is exposed on a first dielectric layer 116 distal from the first substrate 400, and another end of the first conductive route 112 is connected to one of the conductive vias 140. In other embodiments, the third dielectric layer 170 can also form as a first dielectric layer 114 of the first redistribution layer 110, so the first redistribution layer 110 can be formed on the first substrate 400 directly. In other embodiments, conductive bumps 180 can be disposed on the exposed first conductive routes 112, respectively. In other words, the first redistribution layer 110, the conductive vias 140 and the first substrate 300 can collectively form as a workpiece. It should be understood that the fabrication of the workpiece, described herein, is not to limit the present disclosure, it could be adjusted to actual demand by those skilled in the art, without departing from the scope or the spirit of the present disclosure.

Reference is made to FIG. 7, which may correspond to step S302. As shown in FIG. 7, in some embodiments, semiconductor devices 200 are disposed on a side of the first redistribution layer 110 away from the conductive vias 140, and connected to the first redistribution layer 110. In addition, in some embodiments, the semiconductor device 200 includes active surfaces 210, electrically connected to the first redistribution layer 110, or the conductive bumps 180. In some embodiments, because the first redistribution layer 110 is adapted to connect with the semiconductor devices 200, the smallest pitch width of the first redistribution layer 110 can be adjusted to adapt to the fine-pitch semiconductor devices.

Figure 8:
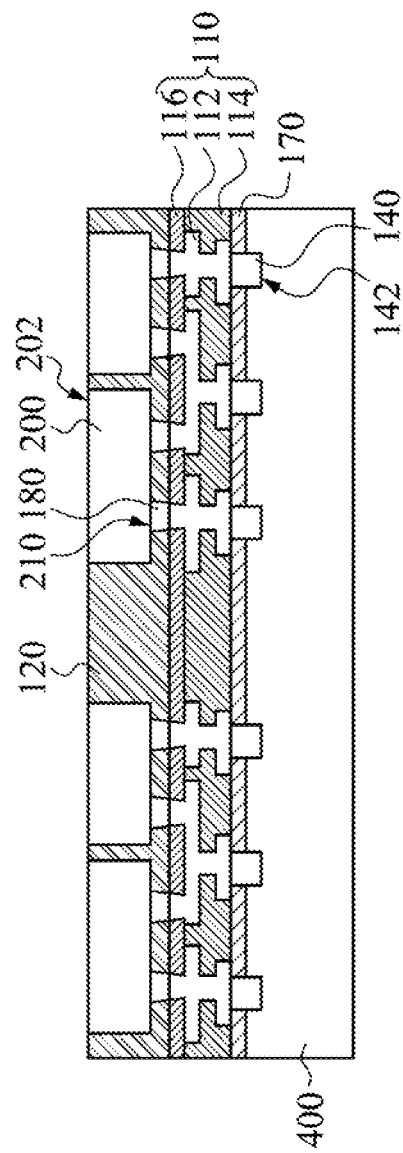

Reference is made to FIG. 8, which may correspond to step S303. As shown in FIG. 8, in some embodiments, a first molding compound 120 is formed from a side of the first redistribution layer 110 opposite to the first substrate 300. The semiconductor devices 200 and the conductive bumps 180 are surrounded by the first molding compound 120. In other embodiments, a bonding material can be attached between the semiconductor devices 200 and the first redistribution layer 110 for reinforcing the bonding of the semiconductor devices 200, in which the first molding compound 120 may fill the remaining part. In some embodiments, the first molding compound 120 can be thinned from a side opposite to the first substrate 300. Surface 202 of the semiconductor devices 200 distal from the first substrate 300 can be exposed. The surface 202 of the semiconductor devices 200 and a surface of the first molding compound 120 facing away from the first redistribution layer 110 can be co-planar. In other embodiments, the semiconductor devices 200 can be encapsulated inside the first molding compound 120.

Figure 9:
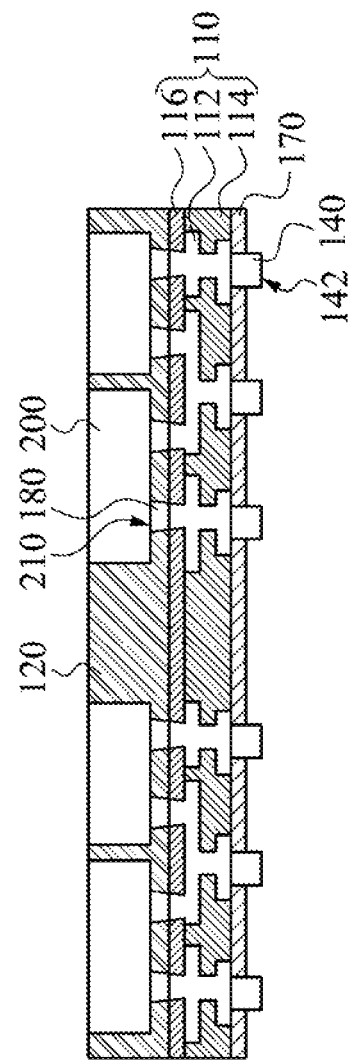

Reference is made to FIG. 9, which may correspond to step S304. As shown in FIG. 9, in some embodiments, the first substrate 300 is removed, and the conductive vias 140 are exposed for further connections. In some embodiments, at least one of the conductive vias 140 can be connected to two or more semiconductor devices through the inter-connected first conductive route 112 of the first redistribution layer 110.

Reference is made to FIG. 10. As shown in FIG. 10, the semiconductor devices 200 can be singulated by sawing or cutting along a sawing street 500 through the first molding compound 120 and the first dielectric layers 114 of the first redistribution layer 110. Furthermore, the singulation of the semiconductor devices 200 is configured to singulate the semiconductor devices 200 disconnected with each other.

Reference is made to FIG. 11. As shown in FIG. 11, the semiconductor devices, especially the singulated semiconductor devices connected with the first redistribution layer 110, are disposed onto a second substrate 600. In some embodiments, the second substrate 600 can be a panel. An attaching film 620 can be formed on the second substrate 600 to attach the semiconductor devices 200.

Figure 12:
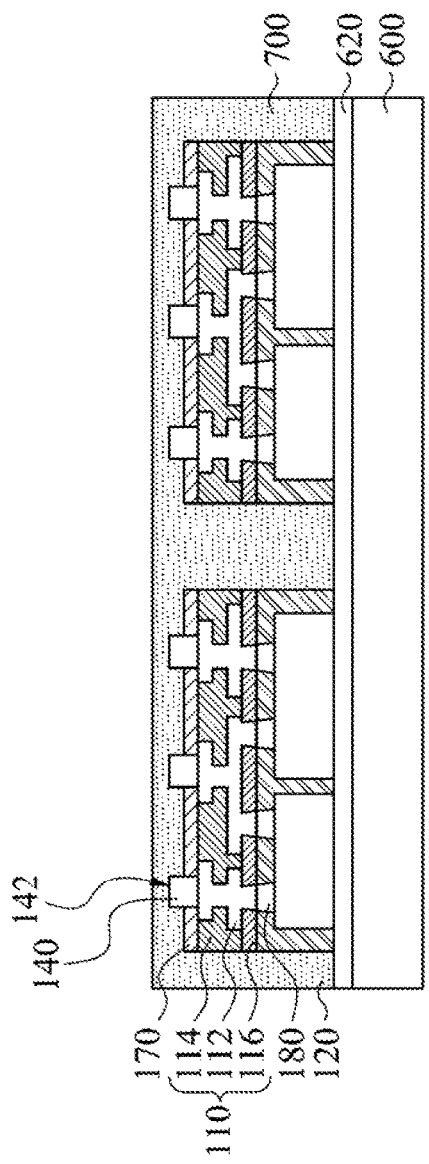
Figure 13:
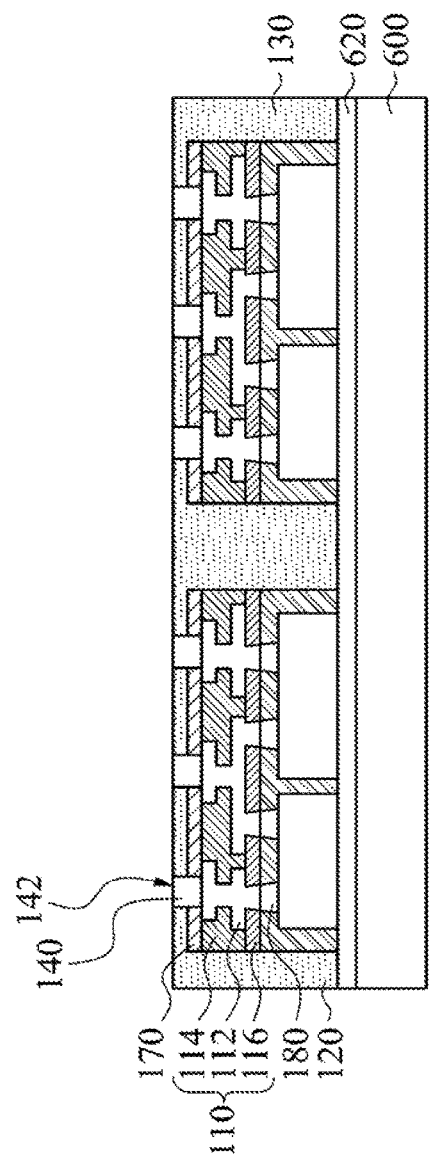

Reference is made to FIGS. 12 and 13, which may correspond to step S305. As shown in FIG. 12, in some embodiments, a second molding compound 700 can be formed on the second substrate 600, and at least a part of the first molding compound 120 and the first redistribution layer 110 are molded inside the second molding compound 700. As shown in FIG. 13, in some embodiments, subsequently, the second molding compound 700 can be thinned from a side opposite to the second substrate 600 to form the second molding compound 130 and expose the conductive vias 140, especially an end 142 of a conductive via 140 distal from the semiconductor device 200. In other embodiments, the second molding compound 130 can be formed without thinning processes, and the end 142 of a conductive via 140 is still exposed.

Figure 14:
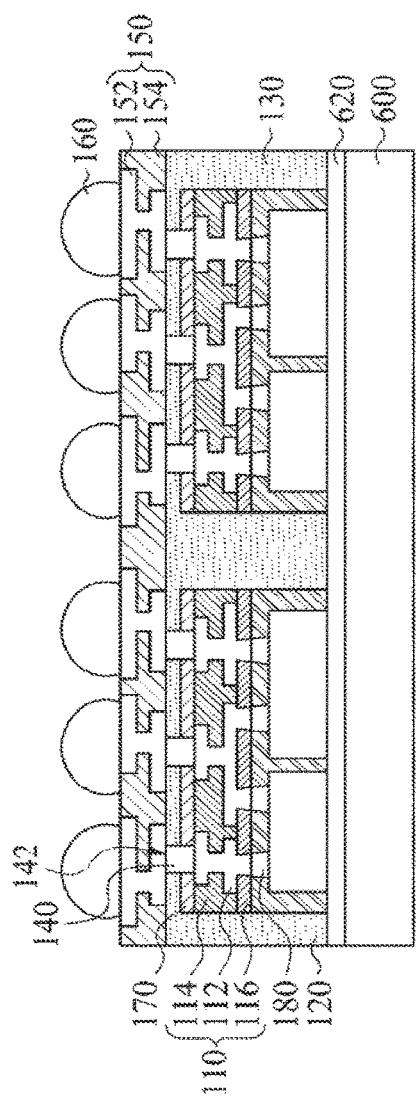

Reference is made to FIG. 14, which may correspond to step S306. As shown in FIG. 14, a second redistribution layer 150 is formed on a surface of the second molding compound 130 away from the first redistribution layer 110. The second redistribution layer 130 is electrically connected to the first redistribution layer 110, or further connected to the semiconductor devices 200, through the exposed conductive vias 140. In some embodiments, because the second redistribution layer 150 can adapt to connect with other components or 110 connections, the smallest pitch width of the second redistribution layer 150 can be greater than or equal to the smallest pitch width of the first redistribution layer 110, connected to the fine-pitch semiconductor devices 200. In some embodiments, solder balls 160 can be formed on the second redistribution layer 150 and electrically connected to the conductive vias 140.

Figure 15:
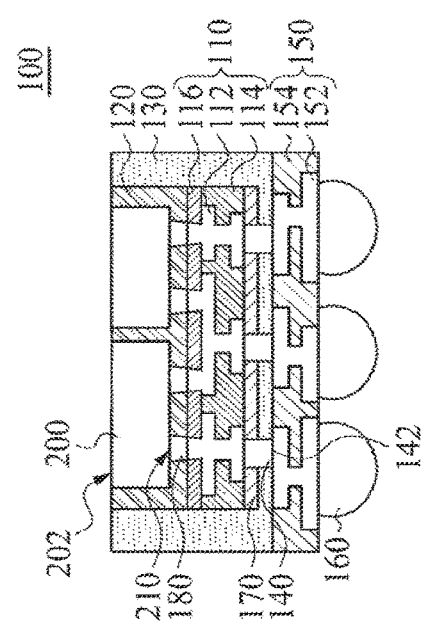

Reference is made to FIG. 15. As shown in FIG. 15, the second substrate 600 can be removed. The semiconductor packages 100 can be singulated by sawing or cutting through the second molding compound 130 and the second dielectric layers 154 of the second redistribution layer 150. In some embodiments, the surface 202 of the semiconductor device 200, a surface of the first molding compound 120, and a surface of the second molding compound 130 facing away from the second redistribution layer 150 can be co-planar.

Summarized from the above, an embodiment of the present disclosure provides a semiconductor package including at least one semiconductor device, a first redistribution layer, a first molding compound, a second molding compound, conductive vias and a second redistribution layer. The first redistribution layer is disposed beneath the semiconductor device, and electrically connected to the semiconductor device. The first molding compound is disposed over the first redistribution layer and surrounding the semiconductor device. The second molding compound is surrounded the first redistribution layer and at least a part of the first molding compound. The conductive vias extend through the second molding compound. The second redistribution layer is disposed on a surface of the second molding compound away from the first redistribution layer. The second redistribution layer is electrically connected to the first redistribution layer through the conductive vias. Because the fan-out structure of the semiconductor package, assembled by the first redistribution layer, the conductive vias and the second redistribution layer, can bridge two different levels of packaging techniques, such as wafer-level chip-scale packaging and panel-level packaging, the semiconductor package would be benefitted with greater compatibility and feasibility, in which various connecting configurations, such as various semiconductor devices and fan-out connections connecting with other components, can be easily adapted.

Another embodiment of the present disclosure provides a method of fabricating semiconductor packages. The method includes providing a workpiece including a first redistribution layer, conductive vias and a first substrate, in which the conductive vias extend into the first substrate and the first redistribution layer is disposed on the first substrate and connected to the conductive vias; subsequently disposing at least one semiconductor device on a side of the first redistribution layer away from the conductive vias, and the semiconductor device being connected to the first redistribution layer; subsequently forming a first molding compound to surround the semiconductor device; subsequently removing the first substrate; subsequently forming a second molding compound to surround the first redistribution layer and at least part of the first molding compound, in which the conductive vias are exposed on a surface of the second molding compound away from the dielectric layer; and then forming a second redistribution layer on a surface of the second molding compound away from the first redistribution layer and electrically connected to the first redistribution layer through the conductive vias.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabrication, composition of matter, means, methods, and steps described in the specification. As one of ordinary skill in the art will readily appreciate from the description of the present disclosure, processes, machines, fabrication, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabrication, compositions of matter, means, methods, or steps.

What is claimed is:
1. A semiconductor package comprising:
a first semiconductor device;

a first redistribution layer disposed beneath the first semiconductor device and electrically connected to the first semiconductor device, the first redistribution layer comprising:
  a first dielectric layer; and
  first discrete conductive routes extending through the first dielectric layer, wherein at least one conductive route of the first discrete conductive routes extends between and connects the first semiconductor device to a second semiconductor device;
a first molding compound disposed over the first redistribution layer and surrounding the first semiconductor device, at least a portion of the first molding compound being disposed between the first semiconductor device and the first redistribution layer and abutting against the first redistribution layer;
a second molding compound surrounding the first redistribution layer and at least a part of the first molding compound;
conductive vias extending through the second molding compound; and
a second redistribution layer disposed beneath a surface of the second molding compound away from the first redistribution layer and electrically connected to the first redistribution layer through the conductive vias.

2. The semiconductor package of claim 1, further comprising a dielectric layer disposed on the surface of the first redistribution layer away from the first molding compound, wherein the conductive vias are further extended through the dielectric layer.

3. The semiconductor package of claim 2, wherein at least one of a dielectric coefficient of the dielectric layer, a dielectric coefficient of the first redistribution layer, and a dielectric coefficient of the second redistribution layer is different from the others of the dielectric coefficients.

4. The semiconductor package of claim 1, wherein a glass transition temperature of the first molding compound is greater than a glass transition temperature of the second molding compound.

5. The semiconductor package of claim 1, wherein a smallest pitch width of the first redistribution layer is distinct from a smallest pitch width of the second redistribution layer.

6. The semiconductor package of claim 1, wherein a surface of each of the first and second semiconductor devices, a surface of the first molding compound, and a surface of the second molding compound faced away from the second redistribution layer are coplanar.

7. The semiconductor package of claim 1, further comprising conductive bumps extended through the first molding compound, to electrically connect the first redistribution layer to the first semiconductor device.

8. The semiconductor package of claim 1, further comprising solder balls disposed on a surface of the second redistribution layer away from the second molding compound, wherein the solder balls are connected to the second redistribution layer respectively.

9. A method for fabricating a semiconductor package comprising:
  providing a workpiece, wherein the workpiece comprising a first redistribution layer, conductive vias and a first wafer, the conductive vias are extended into the first wafer, the first redistribution layer being disposed on the first wafer, connected to the conductive vias, and comprising first discrete conductive routes formed therein;
  disposing a first semiconductor device on a side of the first redistribution layer away from the conductive vias;
  disposing a second semiconductor device on the side of the first redistribution layer away from the conductive vias, the first discrete conductive routes extending between and connecting the first semiconductor device to the second semiconductor device, the first and second semiconductor devices being connected to the first redistribution layer;
  forming a first molding compound to surround the first and second semiconductor devices such that at least a portion of the first molding compound is disposed between the first semiconductor device and the first redistribution layer and abuts against the first redistribution layer;
  removing the first wafer;
  forming a second molding compound to surround the first redistribution layer and at least part of the first molding compound, wherein the conductive vias are exposed on a surface of the second molding compound away from the first redistribution layer; and
  forming a second redistribution layer on a surface of the second molding compound away from the first redistribution layer and electrically connected to the first redistribution layer through the conductive vias.

10. The method of claim 9, further comprising:
depositing a dielectric layer on the first wafer;
forming trenches extending through the dielectric layer and extending into the first wafer; and
filling the trenches with a conductive material to form the conductive vias.

11. The method of claim 9, further comprising:
singulating the first and second semiconductor devices through the first molding compound and the first redistribution layer.

12. The method of claim 9, further comprising:
singulating through the first molding compound and the first redistribution layer to separate the first semiconductor device form the second semiconductor device.

13. The method of claim 9, further comprising:
disposing the first and second semiconductor devices onto a second wafer after the removing of the first wafer.

14. The method of claim 9, wherein a smallest pitch width of the first redistribution layer is distinct from a smallest pitch width of the second redistribution layer.

15. The method of claim 9, wherein materials of the first molding compound is differed from materials of the second molding compound.

16. The method of claim 9, further comprises:
forming solder balls on the second redistribution layer.

17. The semiconductor package of claim 1, wherein the first redistribution layer is encapsulated by the first molding compound and the second molding compound.

18. The semiconductor package of claim 1, wherein the first redistribution layer further comprises:
  a second dielectric layer in contact with the first dielectric layer and having the first discrete conductive routes formed therein.

19. The method of claim 9, wherein forming the first and second molding compounds comprises encapsulating the first redistribution layer with the first and second molding compounds.

20. The semiconductor package of claim 18, where in the first dielectric layer is in contact with the first molding compound.

* * * * *

UNITED STATES PATENT AND TRADEMARK OFFICE
CERTIFICATE OF CORRECTION

PATENT NO. : 10,381,301 B2
APPLICATION NO. : 15/428124
DATED : August 13, 2019
INVENTOR(S) : Shing-Yih Shih It is certified that error appears in the above-identified patent and that said Letters Patent is hereby corrected as shown below:

On the Title Page
In ITEM (73) Assignee:     change "Micro Technology, Inc."
to --Micron Technology, Inc.--

In the Claims
Claim 12, Column 10, Line 39,     change "device form the" to --device from the--

Signed and Sealed this
First Day of October, 2019

Andrei Iancu
*Director of the United States Patent and Trademark Office*